(12) United States Patent
Kolar et al.

(10) Patent No.: US 8,451,670 B2  
(45) Date of Patent: May 28, 2013

(54) ADAPTIVE AND DYNAMIC STABILITY ENHANCEMENT FOR MEMORIES

(75) Inventors: Pramod Kolar, Hillsboro, OR (US); Fatih Hamzaoglu, Portland, OR (US); Yih Wang, Portland, OR (US); Eric A Karl, Portland, OR (US); Yong-Gee Ng, Portland, OR (US); Uddalak Bhattacharya, Beaverton, OR (US); Kevin X. Zhang, Portland, OR (US); Hyunwoo Nho, Seoul (KR)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/888,575

(22) Filed: Sep. 23, 2010

(65) Prior Publication Data

US 2012/0075938 A1 Mar. 29, 2012

(51) Int. Cl.  
*G11C 7/00* (2006.01)

(52) U.S. Cl.  
USPC ..................................... 365/189.14

(58) Field of Classification Search  
USPC ..................................... 365/189.14  
See application file for complete search history.

(56) References Cited

U.S. PATENT DOCUMENTS

2008/0235457 A1* 9/2008 Hasenplaugh et al. ....... 711/130  
2012/0033522 A1* 2/2012 Chuang et al. ........... 365/230.06

* cited by examiner

*Primary Examiner* — Hoai V Ho  
*Assistant Examiner* — Pablo Huerta  
(74) *Attorney, Agent, or Firm* — Blakely, Sokoloff, Taylor & Zafman LLP

(57) ABSTRACT

Adaptive and dynamic stability enhancement for memories is described. In one example, the enhancement includes a plurality of sensors each located near a plurality of memory cells to provide a sensor voltage, a controller to receive the sensor voltage and provide a control signal based thereon, and a read/write assist circuit coupled to the controller to adjust a parameter applied to reading from and writing to a memory cell of the plurality of memory cells in response to the control signal.

20 Claims, 6 Drawing Sheets

ADAPTIVE AND DYNAMIC STABILITY ENHANCEMENT FOR MEMORIES

FIELD

The present invention pertains to the field of memory cell read/write assist control circuitry, and in particular to a compensating scheme for sensed memory cell conditions in a read/write assist system.

BACKGROUND

SRAM (Static Random Access Memory) is a form of volatile memory commonly used for short term, high speed storage. SRAM offers high speed in exchange for high cost and high power consumption compared to many other memory types. It is frequently used as cache memory in processors of many different types, such as central processing units, graphics processors, and controllers. It is also used for caches and buffers in communications interfaces, video interfaces, and signal processors. SRAM is frequently integrated onto the same die with a processor and therefore fabricated using the same technologies, such as CMOS (Complementary Metal Oxide Semiconductor).

As processing circuitry shrinks and operates at lower power, the design margin for SRAM continues to shrink. SRAM bitcells have been produced smaller than 0.1 $\mu m^2$ using 22 nm technology. The consistency and yield of SRAM arrays, however, has declined. In part this is due to increased variation in produced dies. As the components on the die shrink, the same production variations become larger in comparison to the components. These variations mean that some SRAM cells have a higher minimum operating voltage than others on the same die. The reduced size and reduced operating voltages have also reduced the difference between the read voltage and the write voltage.

Die to die variations (variations between dies produced at the same time on a single wafer) result in some dies being limited by a minimum read voltage, while other dies are limited by a minimum write voltage. A slow N (N-type MOS (Metal Oxide Semiconductor) switching voltage) fast P (P-type MOS switching voltage) die would be write limited while a fast N slow P die would be read limited. Operating temperature also affects the characteristics of each die. Many die that are write limited at cold temperatures may be read limited at hot temperatures.

Word-Line Under-Drive (WLUD) has been proposed to improve the $V_{CCmin}$ (minimum operating voltage or Common-Collector Voltage) margin of a memory bitcell. Under-driving the word-line during memory access reduces the effective gate drive thus enhancing read stability. However, WLUD degrades cell writabilty and so increases $V_{CCmin}$ for write operations. In addition, due to the die to die variations and variations within a particular die, the best WLUD to use for different SRAM bitcells or SRAM arrays can be very different. For dies that are fabricated on different wafers, the differences can be still greater. For best performance, each die is characterized independently, however this adds to the production test-time and cost. Shifts in read/write balance due to temperature changes will also have to be characterized. This further increases test-time. In addition, a read-write assist setting will have to chosen that helps meet goals at both low and high temperatures.

Smart and adaptive assist circuits have been introduced to open up the design margin as well as to meet power and performance specifications. $V_{CC}$ scaling is especially important to meet the increasingly stringent power requirements. Although read stability is a major factor limiting voltage scaling for high density SRAM cells, the design window between read stability and the write margin is steadily decreasing and a significant number of SRAM cells can be write limited in a high volume manufacturing environment.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION

An adaptive control system can adjust read/write settings of a memory read/write system based on inputs from a sensor on the memory. In one embodiment, an adaptive SRAM word-line under-drive (AWLUD) approach can use a bitcell-based sensor to dynamically optimize the strength of the WLUD for each die. A blanket application of WLUD improves $V_{CCmin}$ for read-limited dies yet also significantly degrades $V_{CCmin}$ and performance for write-limited dies. By selectively applying WLUD, the benefit of WLUD can be substantially improved. An on-die sensor can be used to classify the die as read or write-limited and a programmable switch can be used to apply the optimal WLUD strength for each individual die. In addition, a die can shift from being write-limited to read-limited with temperature. The sensor can be used to track temperature and process variations, allowing dynamic adjustment of WLUD strength for each die to improve the $V_{CCmin}$ distribution.

In one embodiment, a small PMOS transistor is embedded in each word-line driver and then shared among the 256-row word-line drivers of an array to reduce the area occupied by the PMOS transistor. In one embodiment, a sensor output for an array of SRAM bitcells is converted to digital control bits to provide programmability. The sensor tracks temperature and adaptively changes the read-assist setting. The sensor can also track process skew, voltage, temperature and aging.

Figure 1:
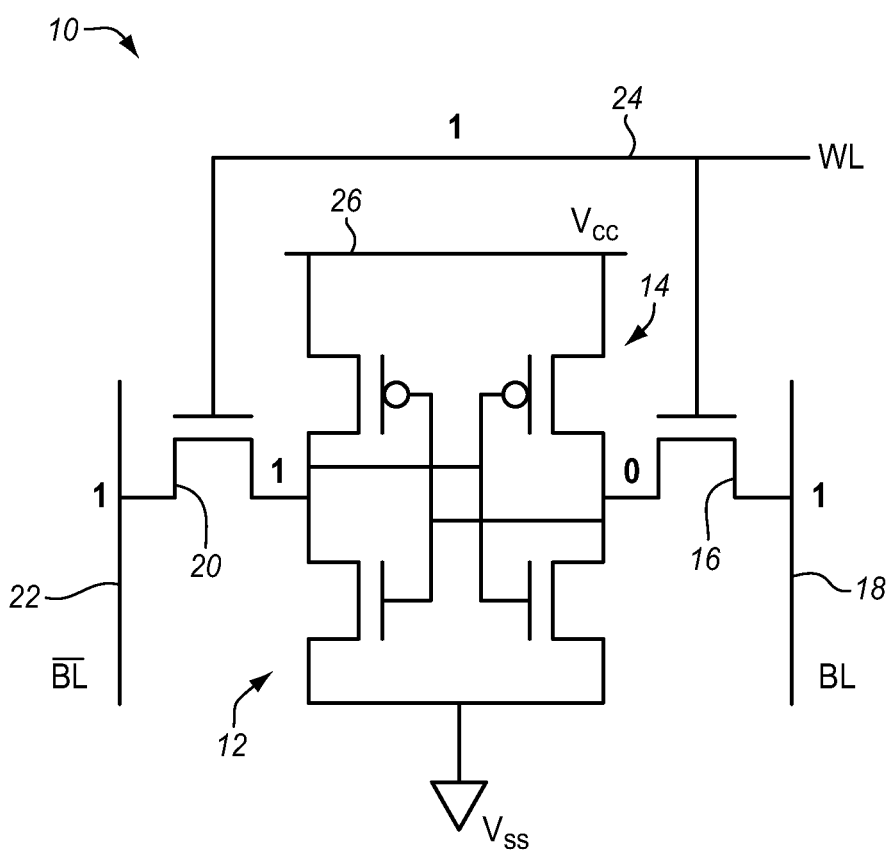
FIG. 1 is a diagram of a six transistor SRAM cell to which embodiments of the invention may be applied.

FIG. 1 shows an example six transistor SRAM cell 10 to which embodiments of the present invention may be applied. Embodiments of the present invention may also be applied to variation and modification of this cell as well as to other types of SRAM cells including eight, ten or more transistor cells. The cell has two cross-coupled inverters 12, 14 that store one of two different states designated as 0 and 1 or low and high. A first access transistor 16 connects to a bitline (BL) to provide the stored state when a read of the memory is performed. A second access transistor 20 connects to an inverted bit line 22 to provide the opposite of the stored state. This line is optional and is typically used for differential signaling.

The cell can be accessed through the access transistors by enabling the word-line (WL) 24. During reads, the bit lines are driven low and high by the cross-coupled inverters and are read by differential sense circuitry. During writes, the bit lines are driven high and low by an external voltage applied to the bit lines when the word-line is enabled. This voltage is set to be high enough that it overrides the voltages stored in the inverters.

A word-line under-drive system reduces the voltage on the word-line 24 during memory access. This reduces the effective gate drive voltage enhancing stability of the inverter states while they are being read. Under driving the WL reduces the required voltage ($V_{CCmin}$) 26 for the cell during reads, but increases the required voltage for the cell during writes. The optimal amount of word-line under-drive (WLUD) differs for different SRAM cells due to production variation, temperature shifts and aging. These variations can be compensated by adapting the word-line under voltage to the conditions of the particular bitcell. Such an adaptation can be implemented, in part, by using a sensor as shown in FIG. 2.

Figure 2:
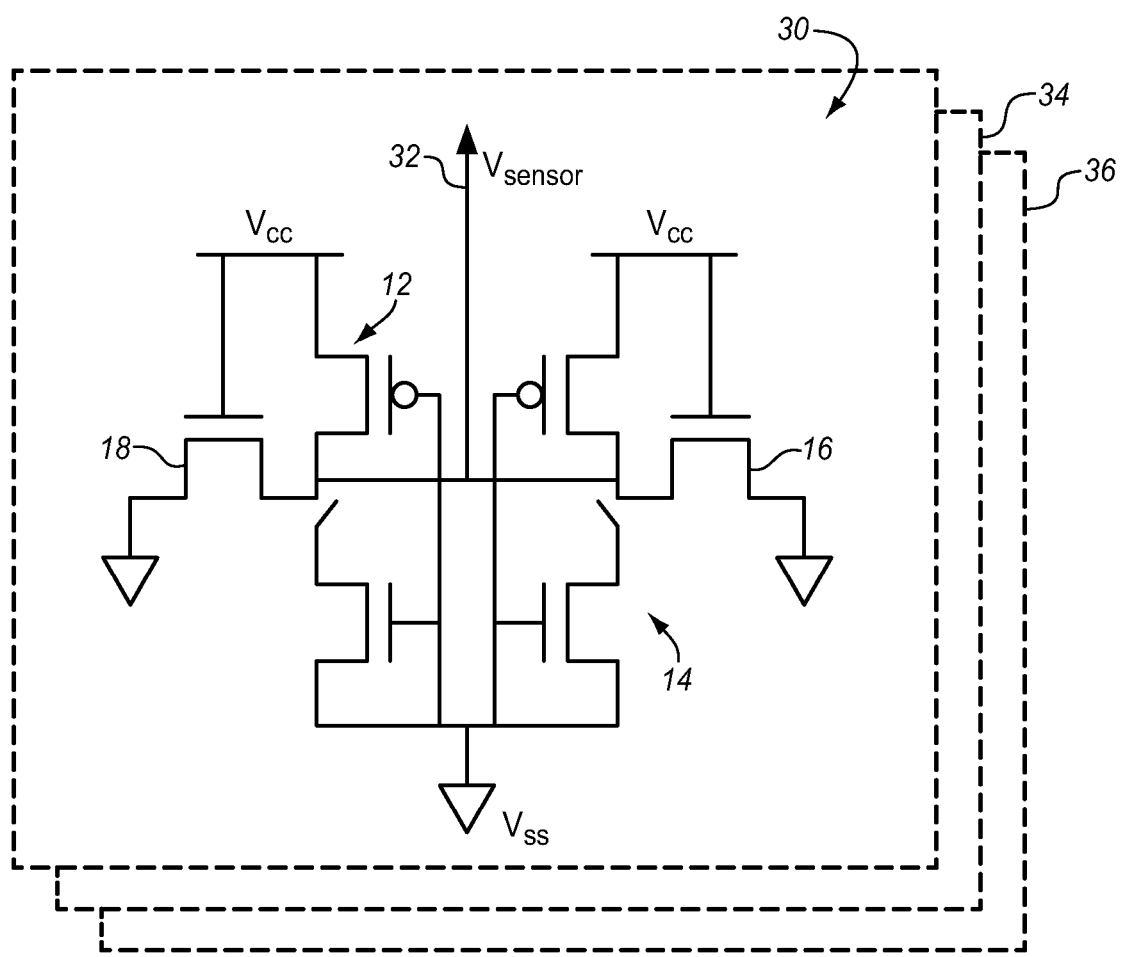
FIG. 2 is a diagram of an example on-die sensor according to an embodiment of the present invention.

The on-die sensor 30 of FIG. 2 can be used to classify the die upon which it is located as read or write-limited. The sensor can track temperature and process variations, allowing dynamic adjustment of the WLUD strength for each die to improve the $V_{CCmin}$ characteristics for the die. The sensor is built to resemble the SRAM cells of the same die. In this example it is based on a six transistor SRAM cell, similar to that of FIG. 1. If the memory array uses 2, 4, 8, 10 transistor or any other configuration, then the sensor can be redesigned appropriately. In one embodiment, the sensor is incorporated into a die in or near an SRAM bitcell array. Preserving the bitcell layout and location causes the sensor to more closely measure the conditions for actual SRAM cells. The behavior of the sensor depends, in part, on the layout of the circuit.

Because the sensor is located on the die near or among the cells of the memory array, it will also age in the same way as the memory cells. Aging is automatically tracked by the sensor regardless of a any initial programming. The read assist signal, which is controlled, at least in part, by the sensor, is accordingly corrected as the circuit ages.

The sensor can be simultaneously shared across multiple subarrays. To provide a more generalized view of the sensed voltage, multiple sensors can be coupled in parallel. This will allow the voltage reading from each sensor to be averaged across all of the other connected sensors. So, for example in a 256 kilobit memory sub-array, there may be 50 to 100 sensors spread throughout the subarray coupled in parallel to provide an average voltage across the sub-array. The best number of sensors and their specific placement throughout a sub-array can be adapted to suit different memory array sizes and topologies.

Alternately, a different sensor can be used in each subarray. However, this may result in larger random variation because a sensor modeled after the layout of a single SRAM cell is not big enough to average out the variations between cells and subarrays in a single array. Alternatively, using a relatively larger centralized sensor located outside of the subarray can allow random variations to be mitigated while the area overhead is minimized because the sensor is shared among tens of subarrays.

In FIG. 2, the SRAM cell of FIG. 1 has been modified to convert it into a sensor cell. The lower transistors of both inverters 12, 14 are disconnected from the corresponding upper transistors. The lower transistors are tied to ground $V_{SS}$ at their drains and the disconnected sources are left to float. The gates of the lower transistors are each coupled to the corresponding gate of the upper transistor of each inverter as in FIG. 1. These gates are all also coupled to ground. The cross coupling between the inverters is also broken. The internal nodes are shorted to each other directly and connected to a $V_{sensor}$ output 32. The gates of the access transistors 16, 18 are no longer tied to a word-line but to $V_{CC}$ together with the sources of the upper transistors of the inverters. The bitline nodes of the access transistors are grounded.

In operation, the sensor, as shown in FIG. 2, has multiple pull-up PMOS transistors and multiple pass-gate NMOS transistors in a series connection. The ratio of the voltage of the pull-up PMOS and pass-gate NMOS determines the sensor output voltage, $V_{sensor}$. The $V_{sensor}$ voltage has a strong correlation to the write margin for the SRAM and therefore can be used to adjust the parameters of a read/write assist circuit. In one example, the sensor output can be used to turn a WLUD on or off. The sensor will track these P/N ratio shifts regardless of cause. The causes can include temperature changes, process skews, aging, supply voltage, and any other factors that affect the performance of the memory cells.

A variety of other electrical parameters can be measured instead or in addition to the P/N ratio shown and described in FIG. 2. For example a sensor node at a pull-down/pass-gate junction may be used to provide an N/N ratio. Other ratios may also be used instead or in addition depending on the particular application.

While several of the transistors of the sensor can be eliminated or substituted with simpler components without changing the electrical function of the circuit, these changes will affect the layout of the parts on the die. By closely following the layout of an SRAM bitcell, the sensor more closely follows the behavior of nearby SRAM bitcells. Multiple sensor cells 34, 36, etc. on the same die or in the same array or subarray can be connected in parallel to give a good average value for the sensor voltage.

Figure 3:
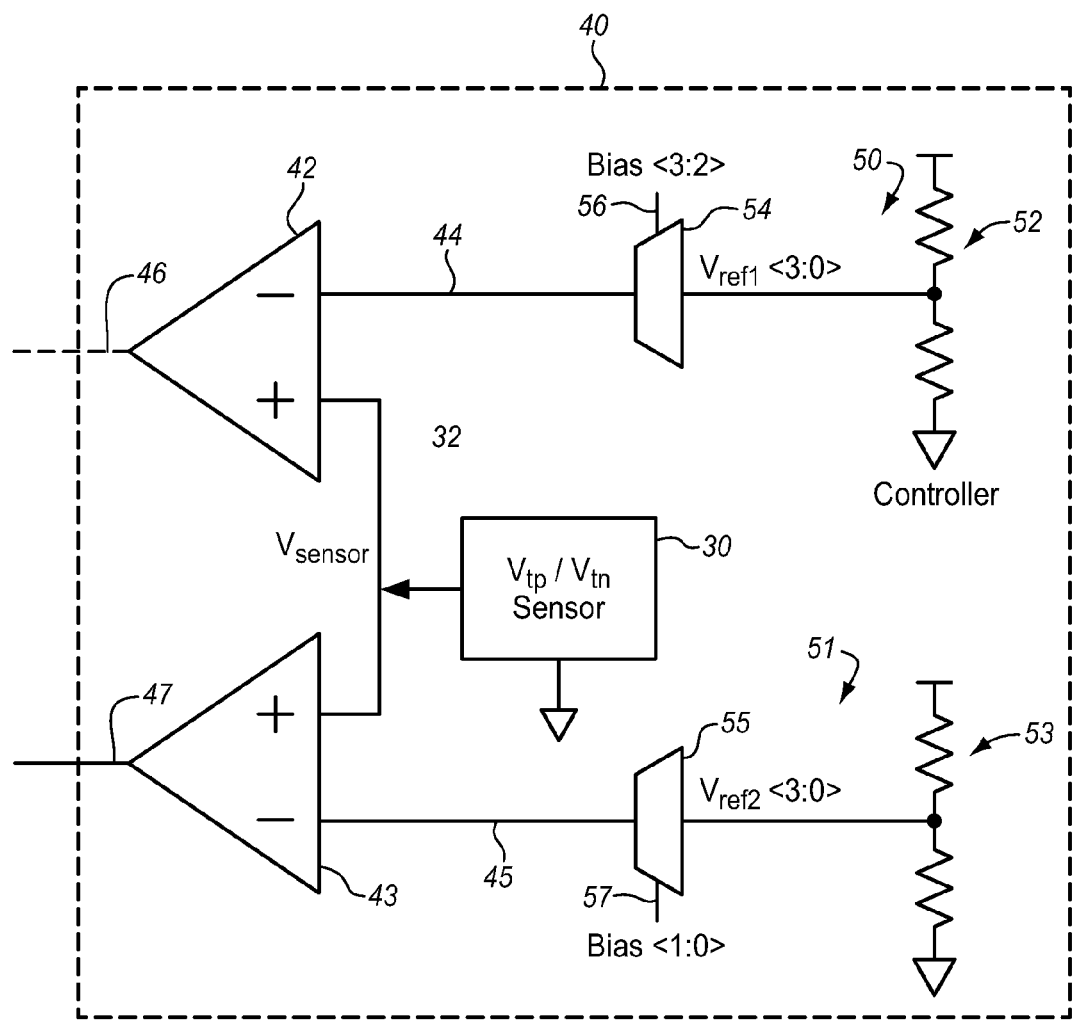
FIG. 3 is a diagram of an example controller module coupled to sensors of the type shown in FIG. 2 according to an embodiment of the present invention.

The sensor output is applied to a controller module 40 shown in FIG. 3. In one embodiment, a plurality of sensors are coupled in parallel to each other and the averaged voltage is coupled to a single controller module. For a single array, there may be multiple sensors on each subarray and a single controller for the entire array. Alternatively, there may be a single controller for multiple arrays, or a controller for each subarray.

The controller has a comparator block with two comparators 42, 43. One input to each comparator is the sensor output voltage 32 and the other is a reference voltage Vref1 44, Vref2 45. The first comparator 42, is configured to produce an output 46 only if the sensor voltage is less than the first reference voltage (Vsensor is <Vref1). This first comparator output 46 can be used to turn on a switch on a WLUD circuit described below. For other types of read/write assist systems, the sensor can be used to turn on or adjust a different setting. In the example circuit, this output will allow a strong WLUD to be applied to the corresponding SRAM bitcell word lines. The second comparator will turn on its output 47, only if the sensor voltage is less than a second reference voltage (Vsensor<Vref2). This turns on a different switch of the WLUD circuit which reduces the voltage of the WLUD.

In the illustrated example, the comparators turn on when Vsensor is less than the corresponding threshold. Also in this example Vref2>Vref1. This provides these 3 states as Vsensor increases: In state 1, Vsensor<Vref1<Vref2. In state 1, P3 and P4 are both on. As Vsensor increases, the system reaches state 1. In state 2, Vref1<Vsensor<Vref2. As a result, P3 is on and P4 is off. If Vsensor increases further, then the system can enter a third state. In this state, Vref1<Vref2<Vsensor. In other words, Vsensor is greater than both thresholds. In this state both P3 and P4 are off.

The comparators naturally have an offset due to production variations that can contribute to the overall error in the system. This error can be compensated by adjusting the reference voltages Vref1, Vref2. In the illustrated example, each reference voltage 44, 45 is generated by a generation circuit 50, 51. The generation circuits each have a voltage divider 52, 53 and a multiplexer 54, 55 each with a bias input 56, 57 for programming. The voltage divider can be configured with a string of resistors with connection nodes between each one (only two resistors are shown in FIG. 3, however more may be used for higher precision). Any one of the different voltage values can be chosen after the circuit is built by making a connection from an appropriate node. Because the voltage of a voltage divider is determined by the ratio of the resistances above and below the node, the divider provides reference voltages that are independent of process variations and temperature.

Figure 4:
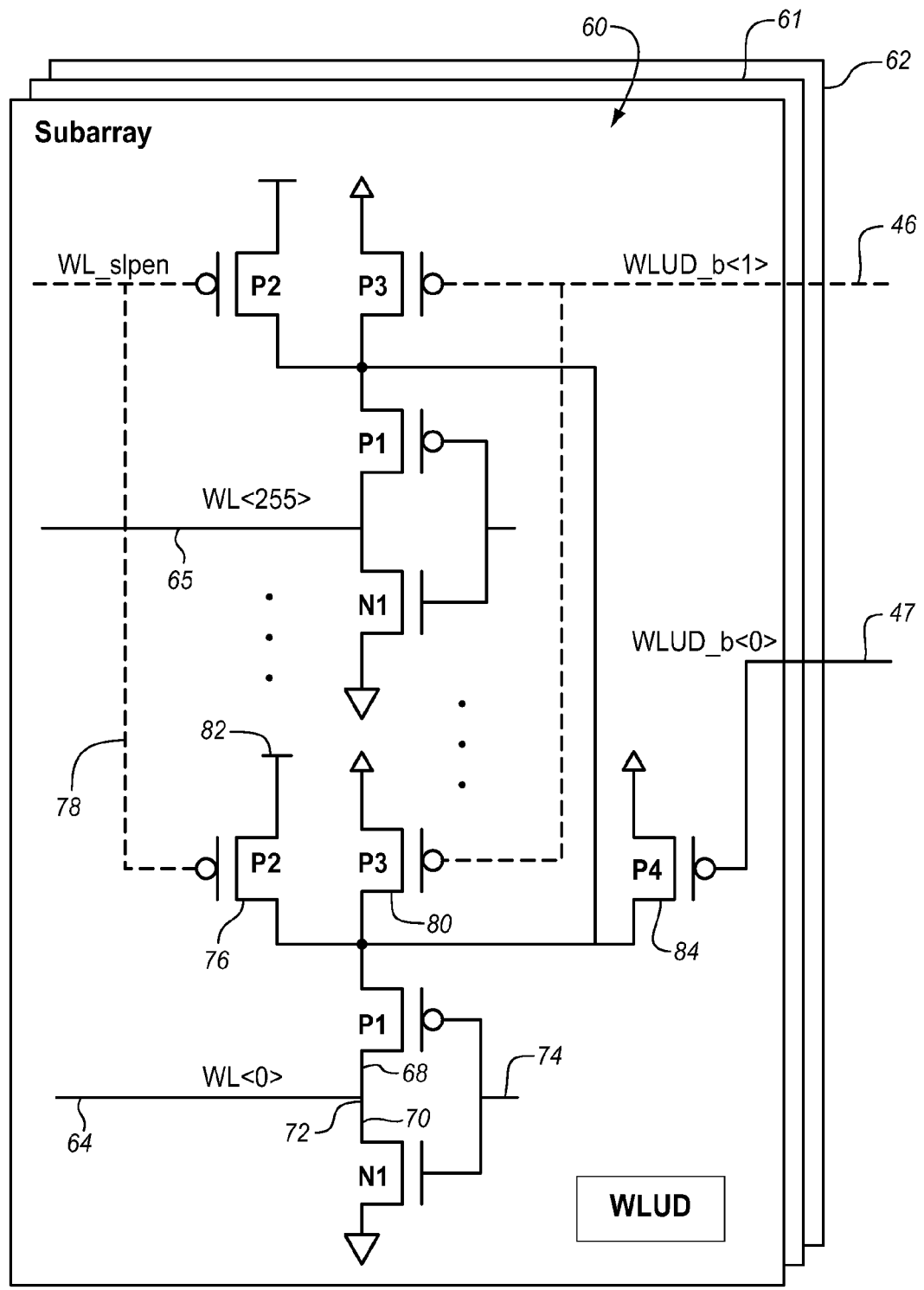
FIG. 4 is a diagram of an example word-line under-drive and read/write circuit coupled to the controller of FIG. 3 according to an embodiment of the present invention.

While voltage dividers, bias input, and comparators are shown, the generation of control signals into the read/write circuit of FIG. 4 can be done in a variety of different ways. The voltage can be converted to digital and applied to logic circuits. The voltage sensor can be coupled to diode-connected transistors, etc. The particular control system can be selected to suit any particular application.

After a die is fabricated, it is typically characterized, tested and calibrated. During characterization, optimal values can be determined to set Vref1 and Vref2. All of the dies on a wafer can typically be programmed with the optimum values. In a high-volume manufacturing environment, the test time to set the reference voltage values may be reduced compared to die-by-die programming. Initially, there may separate read/write $V_{CCmin}$ characterizations. Once the process characterization is complete and the Vref settings are determined, the adaptive WLUD circuits allow for rapid testing. After the initial characterization cost, the test time may be substantially reduced compared to die-by-die programming. Using the WLUD circuits described below, die by die measurements are not necessary because the WLUD circuit will be controlled on and off based on the controller reference voltages and the sensor input.

The reference voltages 44, 45 are applied to comparators 42, 43 for comparison against the sensor voltage 32. The sensor voltage, in this way is converted to two different on, off signals 46, 47. The analog sensor voltage is therefore quantized into digital control signals. The quantization is adjustable using the configurable voltage dividers and the adjustable bias inputs into the voltage reference generator circuits. Additional comparators can be coupled to additional or the same reference voltage circuits to provide additional quantized signals.

The comparator outputs are fed to an adaptive dynamic WLUD circuit 60 such as the example shown in FIG. 4. The WLUD controller 40 of FIG. 3, through the comparator outputs 46, 47 adjusts the strength of the WLUD applied to the SRAM bitcell word lines 24. In one example, there is a separate WLUD circuit 60, 61, 62, etc. for each subarray. Each subarray may be a part of e.g. a 16 kB array. The comparator outputs act as control signals for all of the WLUD circuits of the array. A single controller can control many WLUD circuits. In one example, there is one controller for the array one, a set of sensors for each subarray and one WLUD circuit for each cell of the array. FIG. 4 shows multiple WLUD circuits for each subarray, for example 256, one for each SRAM bitcell. Accordingly, the final stage WL drivers 64, 65 are indicated as WL<0> to WL<255>.

The word-line under-drive circuit reduces the voltage provided by a word-line drive circuit. The word-line drive circuit produces a word-line drive voltage at its outputs. The outputs 64 for the word lines are taken at the junction 66 between a drain 68 and a source 70 of two transistors of an inverter 72. The inverter is coupled between $V_{CC}$ and $V_{SS}$ and has an inverted p-type and an n-type transistor in series, the gates of which are coupled to a common timing reference 74. Such a circuit produces a stable voltage synchronized with a clock pulse. The clock pulse is provided through the common timing reference from an external clock source (not shown). A variety of other switchable voltage source circuits may be used instead of the illustrated circuit and many variations are possible.

The WLUD circuits include optional sleep PMOS transistors 78, one for each circuit. The gates of the sleep switches are coupled to and controlled by a shared sleep enable line 78. The sleep transistor disconnects the inverter from $V_{CC}$ thereby shutting off the word-line drive signal. A sleep controller (not shown) can activate or deactivate any one or more of the WLUD circuits depending on the particular connections made using the sleep enable line. In the illustrated example, the sleep transistors are PMOS transistors with a source coupled to $V_{CC}$ and a drain coupled to the source of the first transistor of the corresponding inverter chain. The sleep circuit reduces power consumption and heat by disconnecting the power supply from the word-line circuits. Other memory circuitry can also be disconnected.

The two outputs of the controller of FIG. 3 are coupled to two different switches of the WLUD of FIG. 4. These will be referred to as the strong switch and the weak switch, based on how much they reduce the word-line drive circuit voltage at the word-line outputs. The strong WLUD setting is provided by a small PMOS transistor 80 embedded in each word-line driver. Each strong WLUD transistor has a source coupled to $V_{SS}$ and a drain coupled to the source of the first transistor of the corresponding inverter chain. When switched on, the strong WLUD transistor will connect the power supply end of the inverter to ground, low or $V_{SS}$. As a result, both ends of the word-line drive inverter are coupled to ground although the source of the inverter is still also coupled to the drive voltage $V_{CC}$ though the sleep switch 76.

Using a small transistor reduces the effectiveness of this connection, so that the word-line voltage is reduced and not completely shorted out. In other words, the weak WLUD switch only partially discharges the word-line supply voltage 82. The gate is coupled to the output 46 of a comparator 42 of the controller of FIG. 3. In the illustrated example, the single comparator output is coupled to all of the WLUD circuits of the subarray to control all of the cells in the subarray using the same control signal 46.

The strong WLUD switches can be switched on to connect both sides of the inverter to $V_{SS}$ shorted in groups of 256 word-line drivers to provide the drive strength to discharge the word-line driver supply voltage ($WLV_{CC}$) 82. Through efficient use of layout space, the distributed strong WLUD transistors incur no area overhead.

A single, large PMOS transistor 84 provides the weak WLUD setting. The weak WLUD switch, like the strong WLUD switch, is coupled at its source to ground and at its drain to the source of each inverter. The gate is coupled to the output 47 of the other comparator 43 of the controller. In the illustrated example, the single weak WLUD switch is shared by the entire 16 kB array. This keeps the area overhead to a minimum (0.1%). The larger transistor for the switch results in a larger or more complete discharge of the word-line supply voltage 82 when switched on.

A WLUD circuit may be made using only a weak switch or a strong switch. This provides less flexibility but reduces the complexity. The particular connections used to under-drive the circuit and the illustrated components can also be modified to suit different applications.

Figure 5:
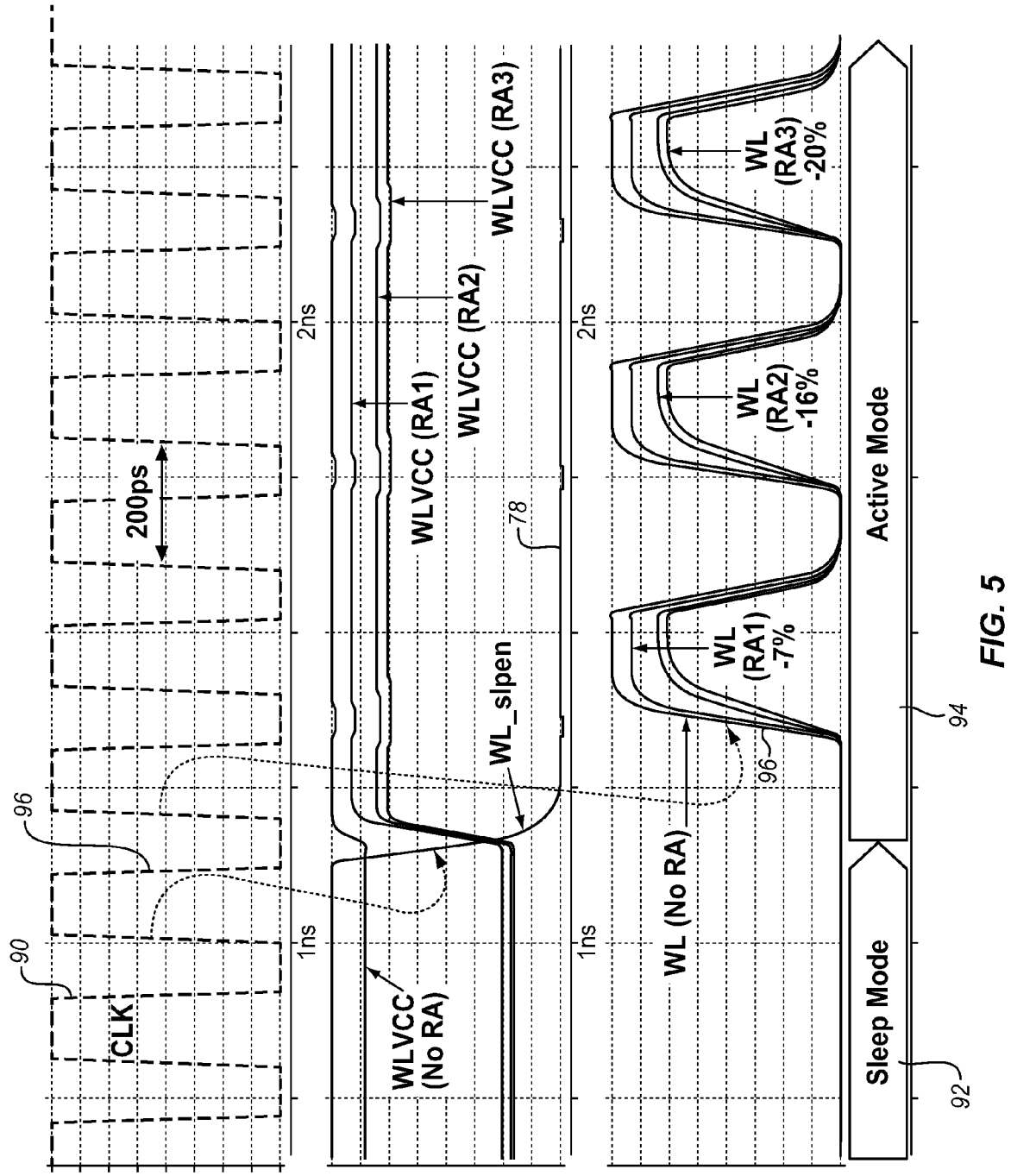
FIG. 5 is diagram of simulated waveforms on a common timing axis to show the operation of a word-line under-drive circuit according to an embodiment of the present invention.
Figure 6:
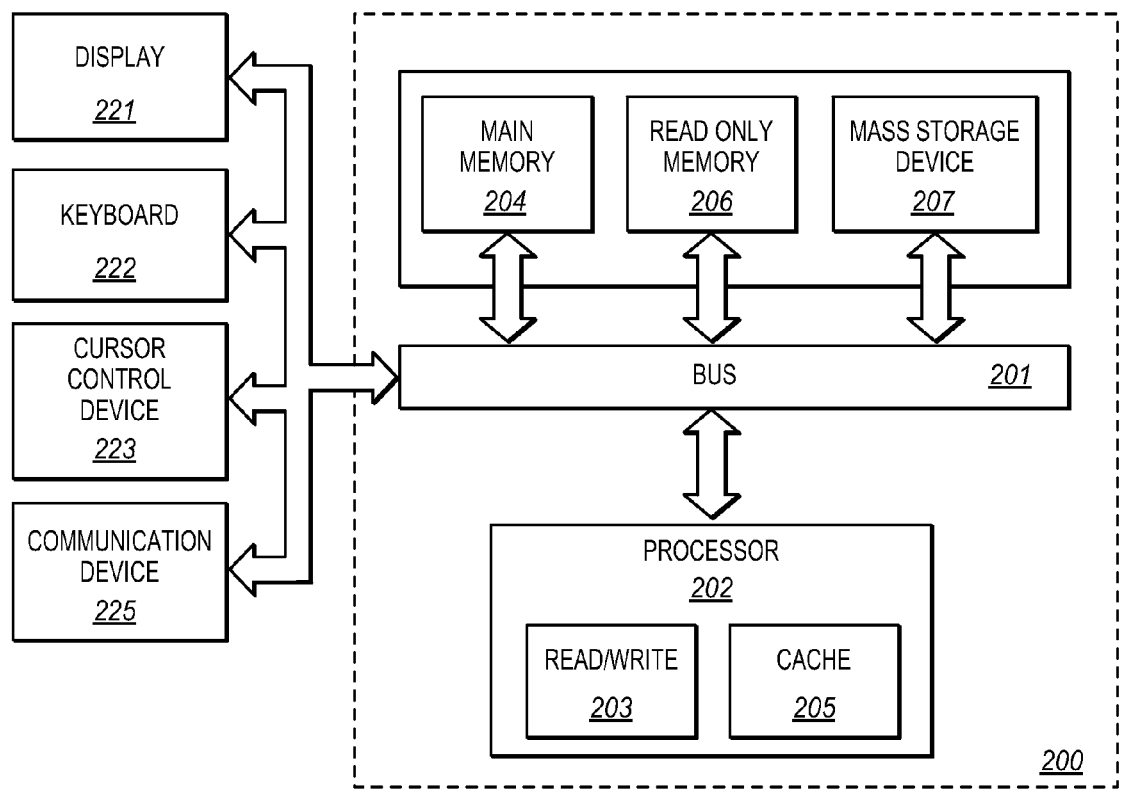
FIG. 6 is a computer system incorporating features of FIGS. 2, 3, and 4 according to an embodiment of the invention.

FIG. 5 shows simulated waveforms generated by the controller of FIG. 3 and the WLUD circuit of FIG. 4 at 5 GHz (200 ps cycle) with a 1 V supply voltage at 95° C. The particular timing and other operational parameters are provided as examples. The system can be operated at many different speeds and temperatures and the specific response time of the circuit can be adapted to suit different conditions. The top graph shows the clock input as a voltage on the horizontal axis plotted against time on the vertical axis. The clock can be used as an input 74 to the inverters of each WLUD circuit.

The middle graph shows the timing of a WL-driver wake-up signal, or sleep enable signal (wl_slpen) 78 and the output $WLV_{CC}$ 64 with different example WLUD settings. At the left end of the time axis, the system is in a sleep mode 92. At the end of the third falling edge 96 of the clock, the sleep enable signal or wake-up signal goes low. The system then enters an active mode 94 on the time scale. One clock cycle later, the word-line 96 is asserted and goes high. $WLV_{CC}$ is restored to the voltage level set by the WLUD circuit. Three pulses of the word-line are shown. After sufficient time is allowed to read or write to the array, the sleep signal can be re-enabled and the word-line will be deactivated again. As can be seen, the sleep enable signal can be used to reduce power consumption and heat in the SRAM array.

FIG. 5 shows a variety of settings identified as RA1, RA2, and RA3. Each setting is determined by the controller and the reference voltage settings. In the illustrated examples, the weakest setting RA1 reduces the word-line voltage by about 7%. The stronger RA2 setting reduces the word-line voltage by about 16% while the strongest setting RA3 provides a reduction of about 20%. In this example, the WLUD strength settings, range from 0 to 20% below $V_{CC}$. However, other ranges can be used by adjusting the reference voltage settings and also by adjusting the parameters of the strong and weak WLUD switches depending on the embodiment. The particular choice of settings from RA1 to RA3 or another setting can be made based on characterization and testing and different choices than those illustrated can be made to suit different applications.

The different power levels RA1, RA2, RA3, correspond directly to the different word-line under-drive voltages of FIG. 4. For RA2, P3 is on and P4 is off. For RA3, P4 and P3 are both on. The WLUD switch is off in all three cases.

FIG. 5 shows a computer system 200 incorporating features of FIGS. 2, 3, and 4 above. The computer system 200 represents an example of a system upon which features of the present invention may be implemented. Other electronic devices with discrete or embedded processors including media recorders, media players, tablets, telephones, personal mobile devices, game consoles, set-top boxes and other devices may take a similar form. This hardware configuration is shown as an example only and a variety of other configurations may be used instead.

The computer system 200 includes a bus or other communication conduit 201 for communicating information, and a processing engine such as a microprocessor, controller, or DSP (digital signal processor) 202 coupled with the bus 201 for processing information. The sensors, controller, and read/write circuits of FIGS. 2, 3, and 4 may be implemented in this device as shown, or in associated supporting chips. The supporting chips may be dedicated chips or dedicated portions of a controller or input/output hub, for example.

The processor 202 includes a read/write system 203 or memory controller such as that shown in FIG. 4. The read/write system 203 is coupled to a cache memory 205 such as an SRAM memory array as shown in FIG. 2, although other types of memory may be used. The controller circuitry of FIG. 3 may be included in either the read/write system or in the cache memory. As mentioned above, the cache may include several memory arrays and memory sub-arrays. The read/write system and cache memory may be included on the same die as the processing engine or one separate die. They may be included in the same package or in a separate package.

The computer system 200 further includes a main memory 204, such as a random access memory (RAM) or other dynamic data storage device, coupled to the bus 201 for storing information and instructions to be executed by the processor 202. The main memory also may be used for storing temporary variables or other intermediate information during execution of instructions by the processor. The main memory may be implemented as a separate device as shown or integrated with the processor in a single chip.

The computer system may also include a nonvolatile memory 206, such as a read only memory (ROM) or other static data storage device coupled to the bus for storing static information and instructions for the processor. A mass memory 207 such as a magnetic disk or optical disc and its corresponding drive may also be coupled to the bus of the computer system for storing information and instructions. The NVRAM and mass memory may also be combined or incorporated into the processor as a single chip.

The computer system can also be coupled via the bus to a display device or monitor 221, such as a Liquid Crystal Display (LCD), for displaying information to a user. In addition to video, graphical and textual indications of installation status, operations status and other information may be presented to the user on the display device. Typically, an alphanumeric input device 222, such as a keyboard with alphanumeric, function and other keys, or a remote control may be coupled to the bus for communicating information and command selections to the processor. A cursor control input device 223, such as a mouse, a trackball, a touch screen interface, or cursor direction keys can be coupled to the bus for communicating direction information and command selections to the processor and to control cursor movement on the display 221.

A communication device 225 is also coupled to the bus 201. The communication device 225 may include a modem, a network interface card, or other well known interface devices, such as those used for coupling to Ethernet, token ring, or other types of physical attachment for purposes of providing a communication link to support a local or wide area network (LAN or WAN), for example. In this manner, the computer system may also be coupled to a number of clients or servers via a conventional network infrastructure, including an intranet or the Internet, for example. Further or alternative communication interfaces may be provided for other types of buses, such as USB (Universal Serial Bus), Firewire (i.Link or IEEE1394), Light Peak or various wireless interfaces.

A lesser or more equipped computer system than the example described above may be preferred for certain implementations. Therefore, the configuration of the exemplary computer system 200 will vary from implementation to implementation depending upon numerous factors, such as price constraints, performance requirements, technological improvements, or other circumstances. The particular nature of any attached devices may be adapted to the intended use of the device. Any one or more of the devices, buses, or interconnects may be eliminated from this system and others may be added.

In the following description, numerous specific details are described to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail but are nonetheless encompassed within the scope of the invention.

Reference throughout this specification to "an example," "one embodiment," or "an embodiment" means that a particular feature, structure, or characteristic described in connection with the embodiment is included in at least one embodiment of the present invention. Thus, appearances of such phrases in this specification do not necessarily all refer to the same embodiment. Furthermore, the particular features, structures, or characteristics may be combined in any suitable manner in one or more embodiments.

The above description of illustrated embodiments of the invention, including what is described in the abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. These modifications can be made to the invention in light of the above detailed description.

The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

The invention claimed is:

1. An apparatus comprising:
    a plurality of sensors each located near a plurality of memory cells to provide a sensor voltage;
    a controller to receive the sensor voltage and provide a control signal based thereon; and
    a read/write assist circuit coupled to the controller to adjust a parameter applied to reading from and writing to a memory cell of the plurality of memory cells in response to the control signal.

2. The apparatus of claim 1, wherein the plurality of sensors are connected in parallel to produce the sensor voltage.

3. The apparatus of claim 2, wherein the plurality of sensors produce an average voltage as the sensor voltage.

4. The apparatus of claim 1, wherein the sensors measure the voltage across cross-coupling nodes of a memory cell.

5. The apparatus of claim 1, wherein the sensors each comprise complementary pull-up and pass-gate transistors and the sensors measure the ratio of a voltage of the pull-up and the pass gate transistors.

6. The apparatus of claim 1, wherein the sensors comprise first and second inverters having connected internal nodes and wherein the sensors measure the voltage at the internal nodes.

7. The apparatus of claim 6, wherein the inverters are coupled between a source voltage and a drain voltage that are applied to cells of the plurality of memory cells.

8. The apparatus of claim 1, wherein the control signal comprises an on or off signal to a gate of the word-line under-drive circuit.

9. The apparatus of claim 1, wherein the controller compares the sensor voltage to a reference voltage to switch the control signal on or off.

10. The apparatus of claim 1, wherein the read/write assist circuit comprises a word-line under-drive circuit to reduce the drive voltage applied to a word-line of a memory cell of the plurality of memory cells in response to the control signal.

11. The apparatus of claim 10, wherein the word-line under-drive circuit comprises a word-line driver circuit and a switch controlled by the controller to reduce the voltage supplied to the word-line drive circuit, wherein the switch is coupled between a power supply to the word-line driver circuit and a ground.

12. The apparatus of claim 11, wherein the switch is coupled between high and low sides of a power supply to the word-line drive circuit.

13. The apparatus of claim 10, wherein the word-line under-drive circuit receives a first control signal from the controller to cause a first switch to reduce the power supply to a word-line drive circuit and a second control signal from the controller to cause a second switch to reduce the power supply to the word-line drive circuit.

14. The apparatus of claim 1, wherein the sensors dynamically track performance variations between and among the plurality of memory cells.

15. The apparatus of claim 14, wherein the controller dynamically adjusts settings of the read/write assist circuit in response to the sensors.

16. A method comprising:
    sensing a voltage at a plurality of sensors each located near a plurality of memory;
    receiving the sensor voltage at a controller and providing a control signal based thereon; and
    adjusting a parameter applied to reading from and writing to a memory cell of the plurality of memory cells in response to the control signal.

17. The method of claim 16, further comprising comparing the sensor voltage to a reference voltage and wherein providing a control signal comprises switching the control signal on or off based on the comparison.

18. The apparatus of claim 16, wherein adjusting a parameter comprises adjusting an amount of under-drive power of a word-line under-drive circuit in response to the control signal.

19. An apparatus comprising:
    a processing engine;
    a system bus coupled to the processing engine and to an input/output hub;
    a plurality of static random access memory cells in a memory array coupled to the processing engine as a cache memory;
    a plurality of sensors each located near memory cells of the memory array each coupled in parallel to provide a combined sensor voltage;
    an under-drive controller to receive the combined sensor voltage and to provide a control signal based thereon; and
    a plurality of read/write assist circuits, each coupled to the controller and to a respective memory cell the memory array to adjust a parameter applied to reading from and writing to a memory cell of the plurality of memory cells in response to the control signal.

20. The apparatus of claim 19, wherein the read/write assist circuits comprise word-line under-drive circuits to reduce the drive voltage applied to a word-line of a memory cell of the memory array in response to the control signal.

* * * * *